United States Patent [19]
Ho

[11] Patent Number: 5,880,004
[45] Date of Patent: Mar. 9, 1999

[54] TRENCH ISOLATION PROCESS

[75] Inventor: Michael Ho, Hsinchu, Taiwan

[73] Assignee: Winbond Electronics Corp., Taiwan

[21] Appl. No.: 872,255

[22] Filed: Jun. 10, 1997

[51] Int. Cl.$^6$ .................................................. H01L 21/76
[52] U.S. Cl. ........................ 438/421; 438/701; 438/713; 438/978; 438/424
[58] Field of Search ................................... 438/227, 421, 438/701, 734, 978, 713, 458, 492

[56] References Cited

U.S. PATENT DOCUMENTS 5,556,797   9/1996   Chi et al. .
5,578,518   11/1996  Koike et al. .
5,683,908   11/1997  Miyashita et al. .

*Primary Examiner*—George Fourson
*Attorney, Agent, or Firm*—Fish & Richardson P.C.

[57] ABSTRACT

A method of providing isolation structure in a semiconductor device having a shallow trench with a rounded top corner is provided for preventing stress centralization as well as current leakage of a device. The method includes the steps of: (a) sequentially forming a pad oxide layer and a silicon nitride layer on a semiconductor substrate; (b) forming an opening in the silicon nitride layer by a first anisotropic etching process, so as to expose an area for forming a shallow trench; (c) performing a wet etching process to remove the pad oxide layer within the opening, the wet etching process removing a portion of the pad oxide layer extending from the opening and under the silicon nitride layer; (d) performing an isotropic etching process to form a hollow with a rounded top corner in the semiconductor substrate, wherein the rounded top corner is located under the silicon nitride layer; and (e) continuously etching the hollow by a second anisotropic etching process using the silicon nitride layer as a mask, thereby forming a shallow trench having a rounded top corner in the semiconductor substrate.

6 Claims, 4 Drawing Sheets

TRENCH ISOLATION PROCESS

BACKGROUND OF THE INVENTION

1. Field of the Invention

This invention relates in general to a semiconductor device isolation process, and more particularly to a shallow trench isolation (STI) process utilized in semiconductor device manufacture.

2. Description of Related Art

With the continual improvement of semiconductor integrated circuit (IC) fabrication techniques, the number of devices which can be packed onto a semiconductor chip has increased greatly, while the size of the individual devices has decreased markedly. Today several million devices can be fabricated on a single chip. Consider, for example, mega-bit memory chips which are commonly used today in personal computers and in other applications. In such high-density memory chips, elements must be properly isolated in order to obtain good performance. The main purpose of device isolation techniques is to provide sufficient electrical insulation between the elements of the devices without using a significant amount of area on the chip. In this way, more space is available for other devices and components.

The so-called Local Oxidation of Silicon (LOCOS) technique has been widely used to form a field oxide for device isolation. In today's deep sub-micron manufacturing process (features sized below 0.25 $\mu$m), however, using the LOCOS technique results in several drawbacks. First, a relatively large device area is needed and an uneven surface is produced during forming of the field oxide by the LOCOS process. Furthermore, the so-called "bird's beak effect" inevitably appears during forming of the field oxide. Because the bird's beak length is difficult to control within 800 Å when using the LOCOS process, a new shallow trench isolation (STI) technique is generally used for the manufacture of semiconductor devices with feature sized below 0.25 $\mu$m.

In a conventional shallow trench isolation (STI) process, an anisotropic dry etching is first performed to form a trench in a silicon substrate having a depth between 0.3 to 0.8 $\mu$m. A chemical vapor deposition (CVD) process is then performed to form a silicon oxide layer overlaying the entire silicon substrate. The silicon oxide layer is etched back to the top surface of the silicon substrate with a portion of the oxide layer retained within the trench. The STI process has the advantages of preventing the "bird's beak effect" and reducing cross-disturbance between adjacent electric fields. Therefore, the STI process is applicable in fabricating deep sub-micron semiconductor devices, so as to prevent the occurrence of punch through or latch out.

FIGS. 1A to 1C illustrate the processing steps for a conventional shallow isolation trench. A pad oxide layer 12 and a silicon nitride ($Si_3N_4$) layer 14 are first formed on a silicon substrate 10 (FIG. 1A). Photolithography and etching processes are performed to define the pattern of the silicon nitride layer 14, which exposes an area that will form a trench (FIG. 1B). Using the silicon nitride layer 14 as a mask, an anisotropic etching process, such as a reactive ion etching (RIE) is then performed to form a shallow trench 16 in the silicon substrate 10 (FIG. 1C).

The top corner profile of the trench is sharp since it is formed by an anisotropic etching process. This sharp profile causes the previously formed gate oxide layer to have an irregular thickness. Thus, the electric field at the area near the trench corner is larger than that of other areas, resulting in current leakage in the devices. Furthermore, gate oxide layer defects are generally found since a large amount of stress is concentrated near the top corner of the shallow trench 16.

SUMMARY OF THE INVENTION

The present invention provides a method of providing isolation structure in a semiconductor device. The isolation structure is a shallow trench formed with a shallow trench isolation (STI) process to provide a rounded top corner which prevents stress centralization as well as current leakage of a device.

In one aspect of the present invention, a method of rounding the top corner of a shallow trench includes the steps of: (a) sequentially forming a pad oxide layer and a silicon nitride layer on a semiconductor substrate; (b) forming an opening in the silicon nitride layer by a first anisotropic etching process, so as to expose an area for forming a shallow trench; (c) performing a wet etching process to remove the pad oxide layer within the opening, the wet etching process removing a portion of the pad oxide layer extending from the opening and under the silicon nitride layer; (d) performing an isotropic etching process to form a hollow with a rounded top corner in the semiconductor substrate, wherein the rounded top corner is located under the silicon nitride layer; and (e) etching the hollow by a second anisotropic etching process using the silicon nitride layer as a mask, thereby forming a shallow trench having a rounded top corner in the semiconductor substrate.

By utilizing the method of this invention, suitable top corner rounding can be obtained without decreasing the fabricating throughput. Moreover, a desired width of the shallow trench can be obtained, thereby providing sufficient isolation between adjacent devices.

BRIEF DESCRIPTION OF THE DRAWINGS

Other objects, features and advantages of the present invention will become apparent by way of the following detailed description of the preferred but non-limiting embodiment, with reference to the following drawings.

DETAILED DESCRIPTION OF THE PREFERRED EMBODIMENT

Figure 1A:
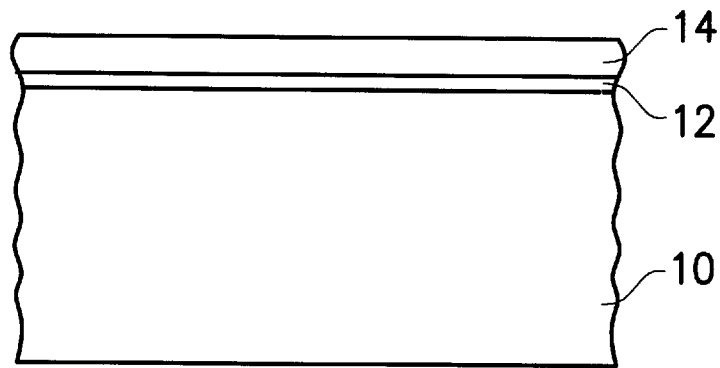
FIGS. 1A to 1C are sequential, cross-sectional views illustrating the manufacturing stages of a conventional shallow trench isolation process.
Figure 1B:
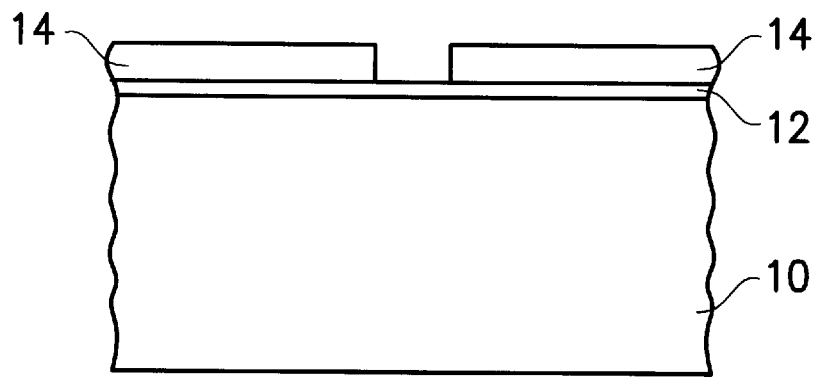
Figure 1C:
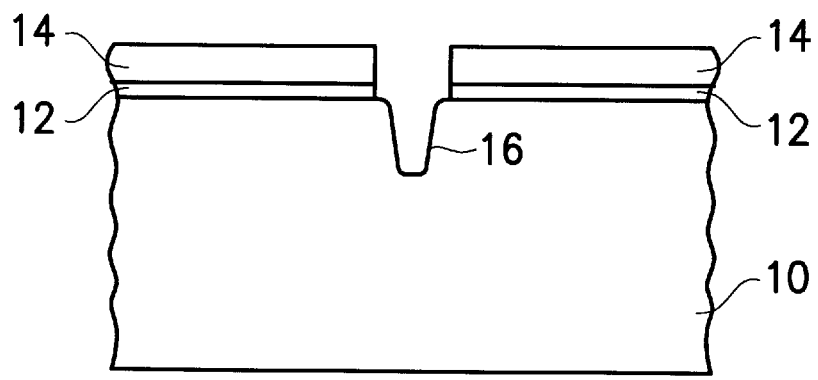
Figure 2A:
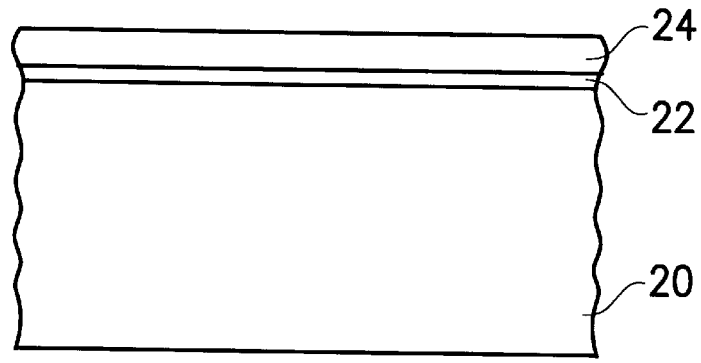
FIGS. 2A to 2E are cross-sectional diagrams illustrating the process of a preferred embodiment according to the present invention.

The present invention provides a method for rounding the top corner of a shallow trench in an STI process, suitable for use in a deep sub-micron manufacturing process (i.e., features sized below 0.25 $\mu$m). Referring to FIG. 2A, a pad oxide layer 22 and a silicon nitride layer 24 are sequentially formed on a semiconductor substrate 20. The pad oxide layer 22 and the silicon nitride layer 24 are formed to a preselected thickness using conventional deposition processes. For example, in one embodiment, the pad oxide layer 22 has a thickness in a range between 200 Å to 600 Å to eliminate the stress between the silicon substrate 20 and the silicon nitride layer 24. The silicon nitride layer 24 has a thickness in a range between 1500 Å to 2000 Å, so that, after patterning by photolithography and etching processes, silicon nitride layer 24 serves as a mask for etching a shallow trench as well as a stop layer for a chemical mechanical-polishing (CMP) process.

Figure 2B:
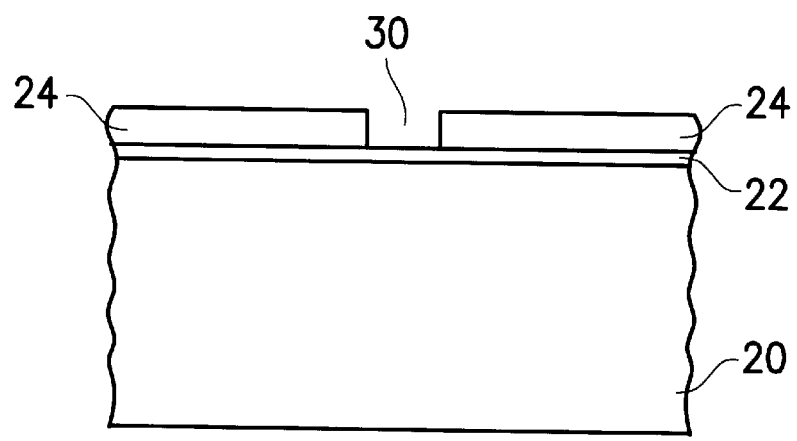

Referring to FIG. 2B, an opening 30 is formed in the silicon nitride layer 24 to expose an area that will form a shallow trench. For example, a photoresist layer (not shown) is first coated on the surface of the silicon nitride layer 24. A photolithography process is performed to define a pattern on the photoresist layer. The pattern of the photoresist layer is then transferred into the silicon nitride layer 24 by an etching process. Thus, the opening 30 is formed in the silicon nitride layer 24.

Figure 2C:
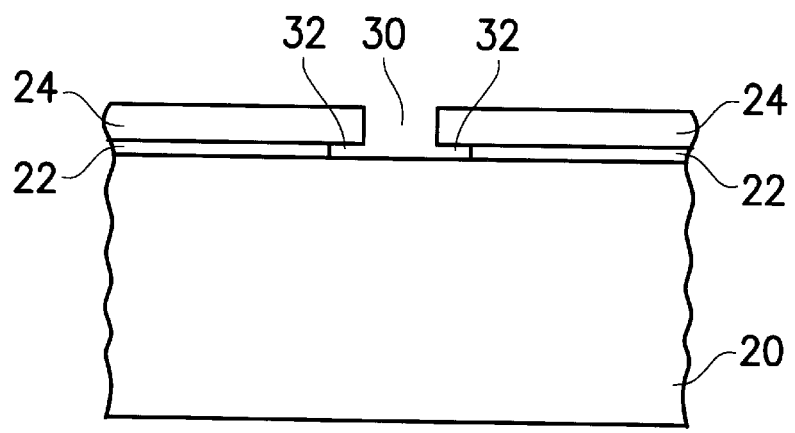

Next referring to FIG. 2C, a wet etching process is performed to remove the pad oxide layer 22 within the opening 30 and also laterally remove a portion of the pad oxide layer 22 under the silicon nitride layer 24. For example, a 10:1 of buffered oxide etchant (BOE) solution containing hydrogen fluoride (HF) is used in the above wet etching process for about 2 minutes. The pad oxide layer 22 is isotropically etched to form a notch 32 under the silicon nitride layer 24 having a length extending from the edge of opening 30 in a range between 700 Å to 1000 Å.

Figure 2D:
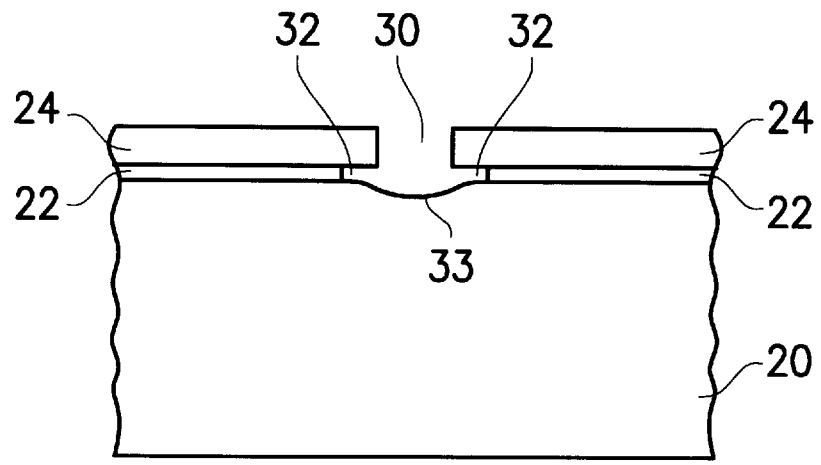

Referring to FIG. 2D, a hollow 33 with a rounded top corner is formed in the silicon substrate 20 using an isotropic etching process. For example, a dry etching process is performed in a dry etcher (not shown) by providing sulfur hexafluoride ($SF_6$) gas and applying a plasma at a power level of about 200W. The top corner rounding is located under the portion of the silicon nitride layer 24 overhanging opening 30 and within notch 32 which is formed between the silicon nitride layer 24 and the silicon substrate 20. Thus, the width of a shallow trench that will form in the proceeding process can be maintained in a desired range.

Figure 2E:
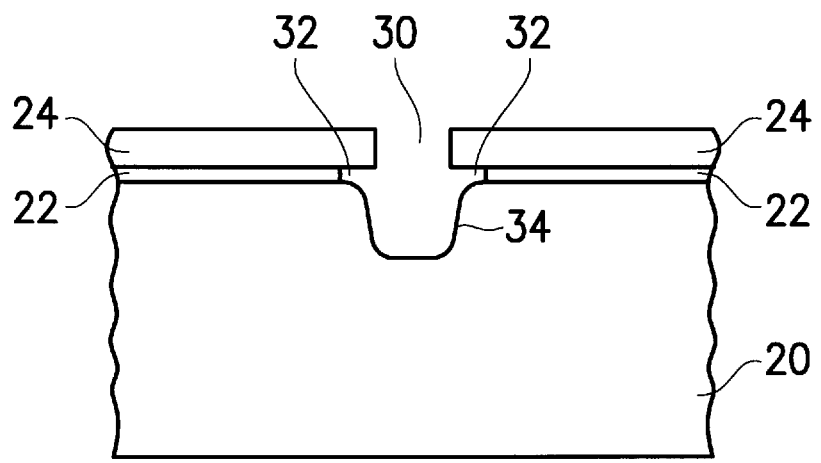

Referring to FIG. 2E, a shallow trench 34 is formed in the silicon substrate 20 by continuously etching the hollow 33 (FIG. 2D) with another anisotropic etching process, such as a conventional dry etching, with the silicon nitride layer 24 used as a mask.

Figure 3:
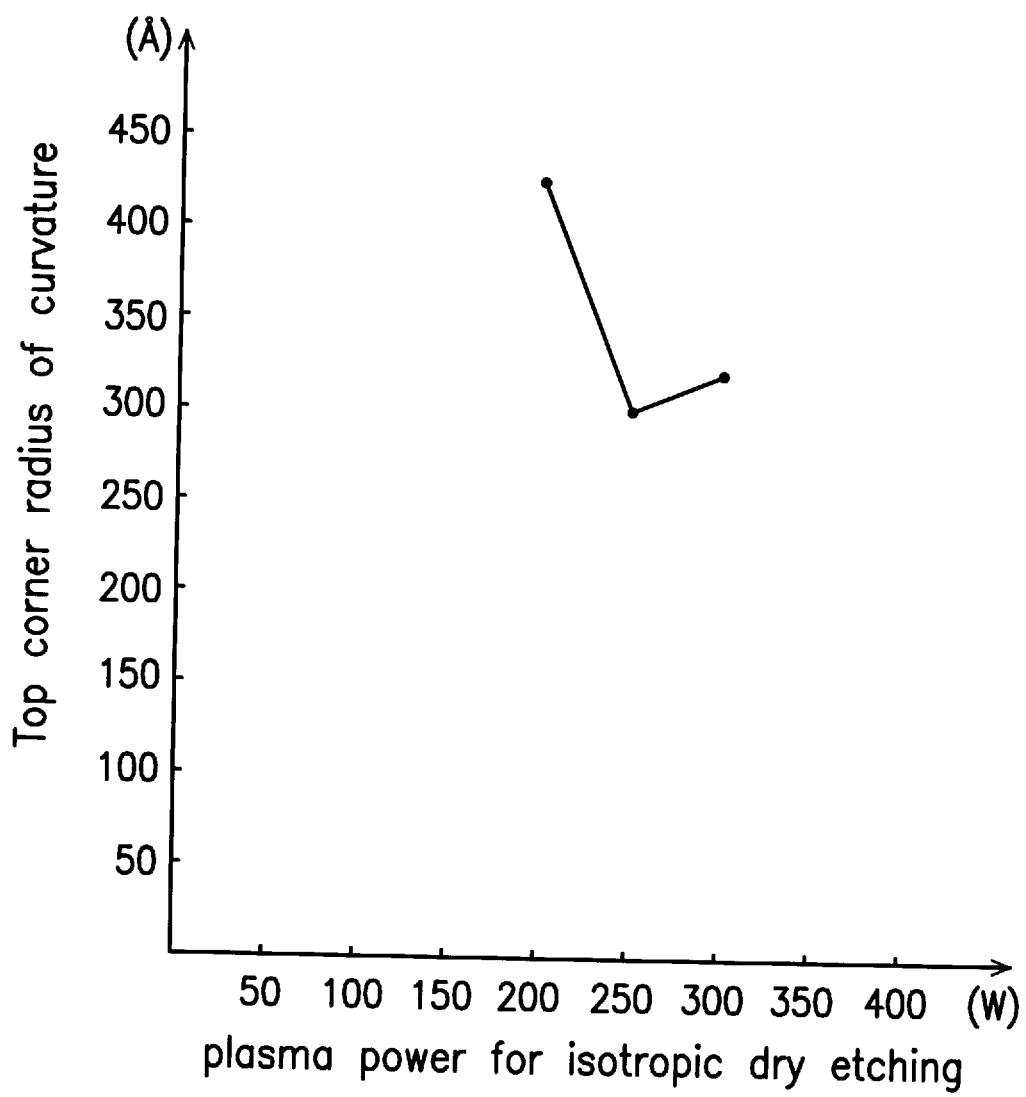
FIG. 3 is a chart showing the relationship between top corner radius of curvature and plasma power for isotropic dry etching.

The present invention forms a rounded top corner in shallow trench isolation process and is suitable for use in a deep sub-micron manufacturing process (features sized below 0.25 $\mu$m). By adjusting the parameters of the etching process, the degree of top corner rounding can be varied. For example, referring to FIG. 3, the radius of curvature of the top corner as a function of plasma power in an isotropic dry etching process is shown. As can be seen in the chart, where the plasma power is in a range between 200 and 250W, the top corner radius of curvature is inversely proportional to the plasma power using an isotropic dry etching process. Thus, the degree of top corner rounding can be controlled by appropriately adjusting the plasma power. For example, the top corner radius of curvature is about 430 Å if a plasma power of 200W is applied.

While the invention has been described by way of example and in terms of a preferred embodiment, it is to be understood that the invention is not to be limited thereto. On the contrary, it is intended that the invention cover various modifications and similar arrangements within the spirit and scope of the appended claims, which should be accorded the broadest interpretation so as to encompass all such modifications and similar arrangements.

What is claimed is:

1. A method of fabricating isolation structure in a semiconductor integrated circuit device comprising the steps of:

(a) sequentially forming a pad oxide layer and a silicon nitride layer on a semiconductor substrate;

(b) forming an opening in said silicon nitride layer by a first anisotropic etching process so as to expose an area for forming a shallow trench;

(c) performing a wet etching process to remove said pad oxide layer within said opening, said etching process removing a portion of said pad oxide layer extending from said opening and under said silicon nitride layer;

(d) performing an isotropic etching process to form a hollow with a rounded top corner in said semiconductor substrate, wherein said top corner rounding is located under said silicon nitride layer; and (e) etching said hollow by a second anisotropic etching process using said silicon nitride layer as a mask, thereby forming a shallow trench having a rounded top corner in said semiconductor substrate.

2. The method recited in claim 1, wherein the etching process in step (c) is a wet etching process performed by utilizing hydrogen fluoride (HF) solution as an etchant.

3. The method recited in claim 1, wherein said pad oxide layer in step (c) is etched to a thickness in a range between 700 Å and 1000 Å.

4. The method recited in claim 1, wherein the isotropic etching process in step (d) is performed in a dry etcher by providing sulfur hexafluoride ($SF_6$) gas.

5. The method recited in claim 1, wherein the isotropic etching process in step (d) is performed by applying a plasma power of about 200W.

6. The method recited in claim 1, wherein the thickness of said silicon nitride layer in step (b) is in a range between 1500 Å and 2000 Å.

* * * * *